United States Patent
Tachibana (10) Patent No.: US 7,452,749 B2
(45) Date of Patent: Nov. 18, 2008

(54) METHOD FOR MANUFACTURING FLIP-CHIP TYPE SEMICONDUCTOR DEVICE FEATURING NICKEL ELECTRODE PADS, AND PLATING APPARATUS USED IN SUCH METHOD

(75) Inventor: Hiroaki Tachibana, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 126 days.

(21) Appl. No.: 11/364,274

(22) Filed: Mar. 1, 2006

(65) Prior Publication Data

US 2006/0199383 A1 Sep. 7, 2006

(30) Foreign Application Priority Data

Mar. 2, 2005 (JP) ............................ 2005-057005

(51) Int. Cl.
*H01L 21/44* (2006.01)
*H01L 21/00* (2006.01)

(52) U.S. Cl. .................. 438/108; 438/674; 438/678; 438/906

(58) Field of Classification Search ............. 438/597, 438/678, 679; 257/E21.586
See application file for complete search history.

(56) References Cited

U.S. PATENT DOCUMENTS

| 6,724,638 | B1 * | 4/2004 | Inagaki et al. | 361/763 |
| 2002/0060904 | A1 * | 5/2002 | Higuchi | 361/760 |
| 2002/0061641 | A1 * | 5/2002 | Yoda | 438/613 |
| 2004/0245112 | A1 * | 12/2004 | Sekimoto et al. | 205/133 |

FOREIGN PATENT DOCUMENTS

| JP | 358023489 A | * | 8/1981 |
| JP | 6-232136 | | 8/1994 |
| JP | 9-69524 | | 3/1997 |
| JP | 10126057 A | * | 5/1998 |
| JP | 11-214421 | | 8/1999 |

* cited by examiner

*Primary Examiner*—Matthew S. Smith
*Assistant Examiner*—Phillip Green
(74) *Attorney, Agent, or Firm*—McGinn IP Law Group, PLLC (57) ABSTRACT

In a method for manufacturing a semiconductor device, either a nickel layer or a nickel-based metal layer is formed on a semiconductor substrate by using a plating process. Then, either the nickel layer or the nickel-based metal layer is washed with one of an aqueous hydrochloric acid solution and an aqueous sulfuric acid solution.

16 Claims, 12 Drawing Sheets

METHOD FOR MANUFACTURING FLIP-CHIP TYPE SEMICONDUCTOR DEVICE FEATURING NICKEL ELECTRODE PADS, AND PLATING APPARATUS USED IN SUCH METHOD

BACKGROUND OF THE INVENTION

1. Field of the Invention

The present invention relates to a method for manufacturing a flip-chip (FC) type semiconductor device featuring nickel (Ni) electrode pads, and also relates to a plating apparatus used in the manufacturing method.

2. Description of the Related Art

An FC type semiconductor device has been developed to meet the demands of higher performance, smaller and lighter size, and higher speed for a piece of small electronic equipment, such as a mobile phone, a mobile personal computer or the like. The FC type semiconductor device has a plurality of electrode pads arranged on a top surface thereof, and a plurality of metal bumps bonded to the electrode pads. In this case, each of the electrode pads may be formed by a suitable metal material, such as aluminum (Al), copper (Cu) or the like. On the other hand, each of the metal bumps may be composed of various metal materials, such as tin (Sn), tin alloy, gold (Au), copper (Cu), lead (Pb) or the like, and serves as an electrode terminal.

The FC type semiconductor device having no metal bumps may be commercially distributed and circulated in a market as a part for manufacturing an electronic package, such as ball grid array (BGA) packages or the like. In this case, the metal bumps are bonded to the respective electrode pads of the FC type semiconductor device later on. When either tin (Sn) or tin alloy is selected as a metal material for the metal bumps, tin atoms may be diffused so as to penetrate into the interior of the FC semiconductor device through the electrode pads, and the penetrated tin atoms may cause damages in the FC semiconductor device.

For example, as disclosed in JP-H06-232136-A, JP-H09-069524-A and JP-H11-214421-A, it has been proposed that a nickel (Ni) layer be formed as a barrier layer on the electrode pad to prevent the penetration of the tin atoms into the interior of the FC semiconductor device.

The formation of the Ni layer can be carried out by using either an electroplating process or an electroless plating process. In either case, when either the electroplating process or the electroless plating process is completed, the Ni layer is drenched with an aqueous nickel-plating solution, and must be washed with pure water to remove the aqueous nickel-plating solution therefrom so that the Ni layer can be prevented from being corroded with aqueous nickel-plating solution.

SUMMARY OF THE INVENTION

It has now been discovered that the above-mentioned prior art has a problem to be solved as mentioned hereinbelow.

Conventionally, it has been considered that the aqueous nickel-plating solution could be substantially completely removed from the Ni layer by washing the Ni layer with pure water. Nevertheless, according to the inventor's research, in reality, a residue component, which is composed of inorganic salts, organic additives and so on contained in the aqueous nickel-plating solution, is inevitably left on the Ni layer. The residue component causes a corrosion of the Ni layer, resulting in premature deterioration of the FC type semiconductor device.

In accordance with a first aspect of the present invention, there is provided a method for manufacturing a semiconductor device. In this manufacturing method, either a nickel layer or a nickel-based metal layer is formed on or above a semiconductor substrate by using a plating process, either the nickel metal layer or the nickel-based metal layer is washed with one of an aqueous hydrochloric acid solution and an aqueous sulfuric acid solution.

The nickel-based metal layer may be defined as a nickel alloy layer. Also, the aqueous hydrochloric acid solution may have a density falling within a range from 1 to 20 wt %, preferably, from 5 to 15 wt %. Similarly, the aqueous sulfuric acid solution may have a density falling within a range from 1 to 20 wt %, preferably, from 5 to 15 wt %. Further, the plating process may comprise either an electroplating process or an electroless plating process.

The semiconductor substrate may include a multi-layered wiring structure formed thereon. In this case, the formation of either the nickel layer or the nickel-based metal layer is carried out on a top surface of the multi-layered wiring structure.

The multi-layered wiring structure may include an uppermost wiring pattern layer formed on the top surface thereof. In this case, the formation of either the nickel layer or the nickel-based metal layer is carried out on the uppermost wiring pattern layer. The uppermost wiring pattern layer may be composed of one of aluminum and copper. Either the nickel layer or the nickel-based metal layer may serve as an electrode pad on the uppermost wiring pattern layer.

In the manufacturing method, a metal seed layer may be formed on the uppermost wiring pattern layer before the plating process is executed. In this case, the formation of either the nickel layer or the nickel-based metal layer is carried out on the metal seed layer. The metal seed layer may be defined as a copper layer.

In the manufacturing method, either the nickel layer or the nickel-based metal layer may be washed with pure water before either the nickel layer or the nickel-based metal layer is washed with one of the aqueous hydrochloric acid solution and the aqueous sulfuric acid solution.

Also, either the nickel layer and the nickel-based metal layer may be washed with pure water after either the nickel layer or the nickel-based metal layer is washed with one of the aqueous hydrochloric acid solution and the aqueous sulfuric acid solution. In this case, a protective metal layer may be formed on either the nickel layer or the nickel-based metal layer by using another plating process.

The protective metal layer may be composed of one of tin (Sn), tin (Sn) alloy, copper (Cu), copper (Cu) alloy, gold (Au), gold (Au) alloy and so on.

In accordance with a second aspect of the present invention, there is provided a plating apparatus used for manufacturing a semiconductor device to form one a nickel layer and a nickel-based metal layer on an electrode-pad formation area defined on a multi-layered wiring structure of the semiconductor device. The apparatus includes a plating section in which the formation of the one of the nickel layer and the nickel-based metal layer is,carried out, and an acid washing section in which the one of the nickel layer and the nickel-based metal layer is washed with one of an aqueous hydrochloric acid solution and an aqueous sulfuric acid solution.

The plating apparatus may further comprise a pure-water washing section in which the one of the nickel layer and the nickel-based metal layer is washed with a pure water before the one of the nickel layer and the nickel-based metal layer is washed with one of the aqueous hydrochloric acid solution and the aqueous sulfuric acid solution.

Also, the plating apparatus may further comprise a pure water washing section in which the one of the nickel layer and the nickel-based metal layer is washed with a pure water after either the nickel layer or the nickel-based metal layer is washed with one of the aqueous hydrochloric acid solution and the aqueous sulfuric acid solution, and another plating section in which a protective metal layer is formed on either the nickel layer or the nickel-based metal layer.

Each of the plating sections may be defined as one of an electroplating section and an electroless plating section. Also, when one of the plating sections is defined as an electroplating process, and the other plating section may be defined as an electroless plating process.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

Figure 1:
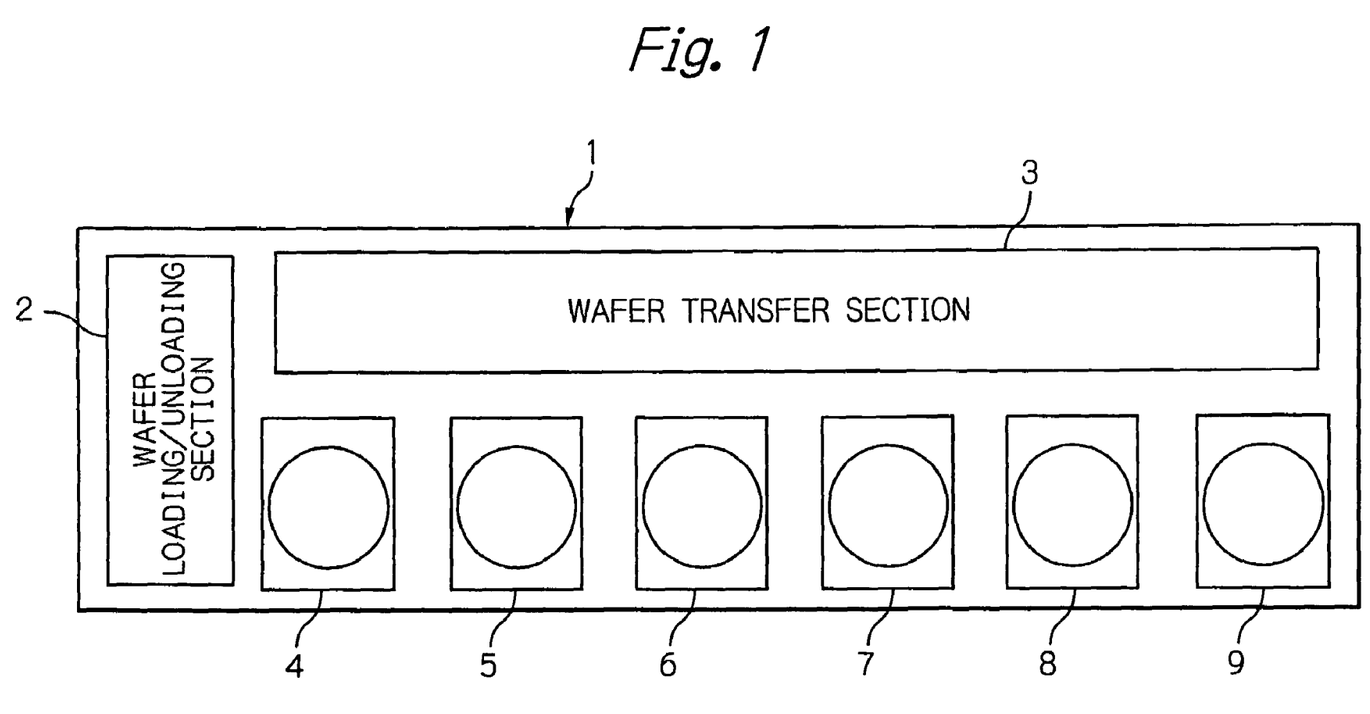
FIG. 1 is a schematic plan view of an electroplating apparatus according to the present invention.

With reference to FIG. 1, an embodiment of an plating apparatus according to the present is schematically illustrated in a plan view.

The plating apparatus, generally indicated by reference 1, includes a wafer loading/unloading section 2, and a wafer transfer section 3 associated with the wafer loading/unloading section 2. Although not illustrated in FIG. 1, a wafer cassette holding a plurality of wafers is carried into and out the wafer loading/unloading section 2. The wafer transfer section 3 is provided with an automatic wafer transferring system (not shown), by which wafers to be processed are unloaded from the wafer cassette, and by which processed wafers are loaded into the wafer cassette.

The electroplating apparatus 1 further includes a pure-water washing bath section 4, a pre-treatment bath section 5, a nickel-plating bath section 6, an acid washing bath section 7, a plating bath section 8 and a post-treatment bath section 9, which are arranged in order along the wafer transfer section 3. Note, the arrangement of the sections 4 through 9 may be suitably modified in order.

The pure-water washing bath section 4 holds a pure water, and the pre-treatment bath section 5 holds an aqueous pre-treatment solution containing inorganic acids, organic aids and so on.

The nickel-plating bath section 6 holds an aqueous nickel (Ni) electroplating solution containing a nickel compound such as nickel sulfamate, inorganic salts, organic additives and so on.

The acid washing bath section 7 holds either an aqueous hydrochloric acid solution bath or an aqueous sulfuric acid solution.

The plating bath section 8 holds one of an aqueous tin (Sn) electroplating solution, an aqueous tin (Sn) alloy electroplating solution, an aqueous copper (Cu) electroplating solution, an aqueous copper (Cu) alloy electroplating solution, a gold (Au) electroplating solution and a gold (Au) alloy electroplating solution.

Also, the post-treatment bath section 9 holds a pure water, and may be provided with a spin-dryer.

Note, in FIG. 1, reference W indicates wafers to be processed in each of the sections 4 through 9, and the wafers W can be moved from one of the sections 4 through 9 to another section by the wafer transfer system provided in the wafer transfer section 3.

With reference to FIGS. 2A to 2K, an embodiment of the method for manufacturing an FC type semiconductor device according to the present invention is explained below.

Figure 2A:
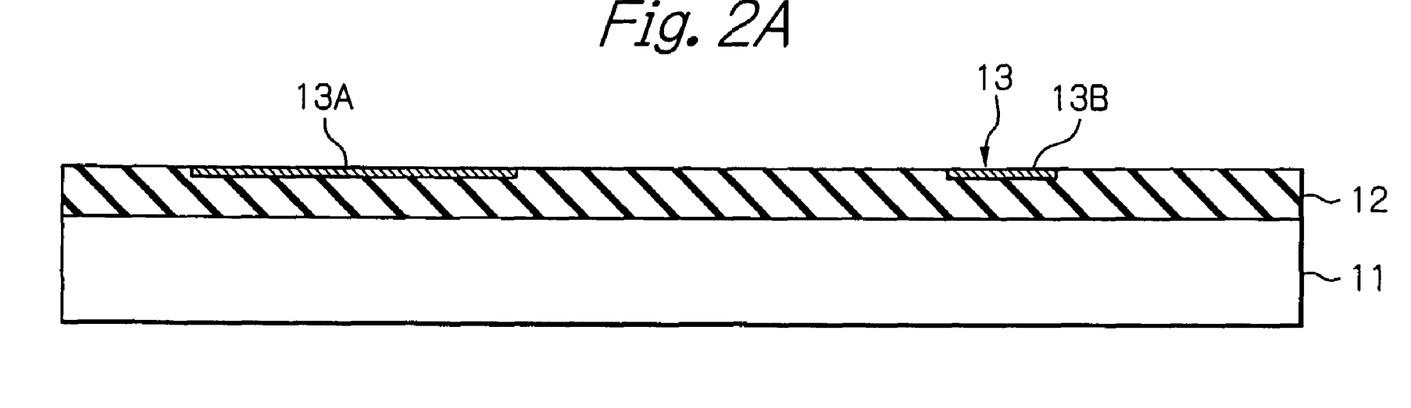
FIGS. 2A through 2K are partial cross-sectional views for explaining an embodiment of the method for manufacturing an FC type semiconductor device according to the present invention.

First, referring to FIG. 2A, reference 11 indicates a semiconductor substrate, which may be derived from a semiconductor wafer such as a monocrystalline silicon wafer. Although not shown in FIG. 2A, various semiconductor elements, such as transistors, resistors, capacitors and so on, are formed in the semiconductor substrate 11, using various well-known processes. Then, a multi-layered wiring structure 12, including insulating interlayers and wiring pattern layers which are alternately stacked with each other, is formed on the semiconductor substrate 11.

Note, in FIG. 2A, an uppermost wiring pattern layer, which is formed a top surface of the multi-layered wiring structure 12, is indicated by reference 13, and may include an electrode pad 13A, and a conductive layer 13B. Also, note that the uppermost wiring pattern layer 13 is composed of a suitable metal material, such as aluminum, copper or the like.

Figure 2B:
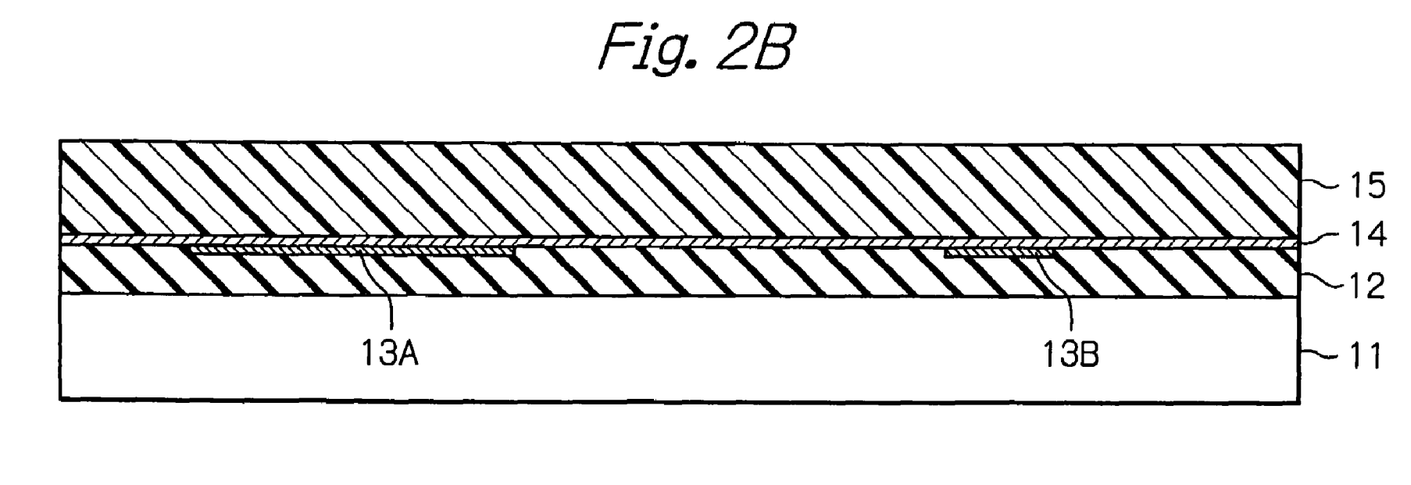

Next, referring to FIG. 2B, a copper (Cu) seed layer 14 is formed on a surface of the multi-layered wiring structure 12 so that the uppermost wiring pattern layer 13 is covered with the Cu seed layer 14. Then, a photoresist layer 15 is formed on the Cu seed layer 14 by using a spin-coat process.

Figure 2C:
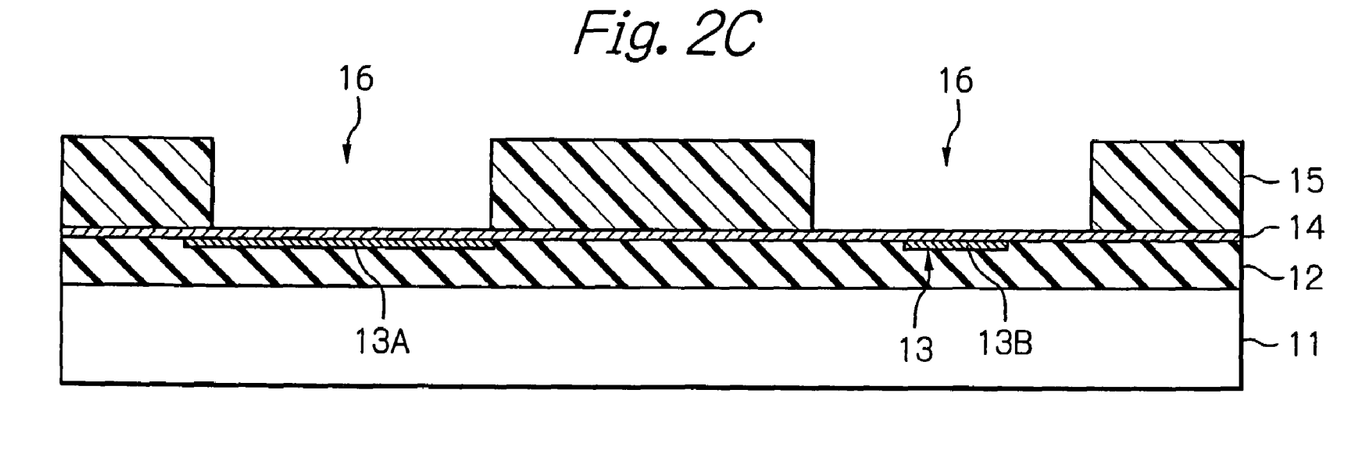

Next, referring to FIG. 2C, the photoresist layer 15 is perforated by using a photolithography process so that respective openings 16 are formed in the photoresist layer 15, whereby respective electrode-pad formation areas are defined on the Cu seed layer by the openings 16. Namely, each of the openings 16 reaches the Cu seed layer 14 so that a surface area of the Cu seed layer 14 is exposed as an electrode-pad formation area to the exterior.

Thereafter, the semiconductor device (wafer) is loaded into a wafer cassette (not shown), and the wafer cassette is carried into the wafer loading/unloading section 2 of the electroplating apparatus 1 of FIG. 1.

At the wafer loading/unloading section 2, the semiconductor device (wafer) concerned is unloaded from the wafer cassette by the wafer transfer section 3 of FIG. 1, and is moved from the wafer loading/unloading section 2 to the pre-treatment bath section 5 of FIG. 1 by the wafer transfer section 3. Then, the semiconductor device (wafer) is immersed in and washed with the aqueous pre-treatment solution held in the pre-treatment bath section 5, whereby the exposed surface areas or electrode-pad formation areas of the Cu seed layer 14 are degreased and activated. Then, if necessary, the semiconductor device (wafer) may be moved from the pre-treatment bath section 5 to the pure-water washing bath section 4 for washing the semiconductor device (wafer) with the pure water to thereby remove the aqueous pre-treatment solution from the semiconductor device (wafer).

In either event, the semiconductor device (wafer) is moved from either the pure-water washing bath section 4 or the pre-treatment bath section 5 to the nickel-plating bath section 6 of FIG. 1, and is immersed in the aqueous Ni electroplating solution held in the nickel-plating bath section 6.

Figure 2D:
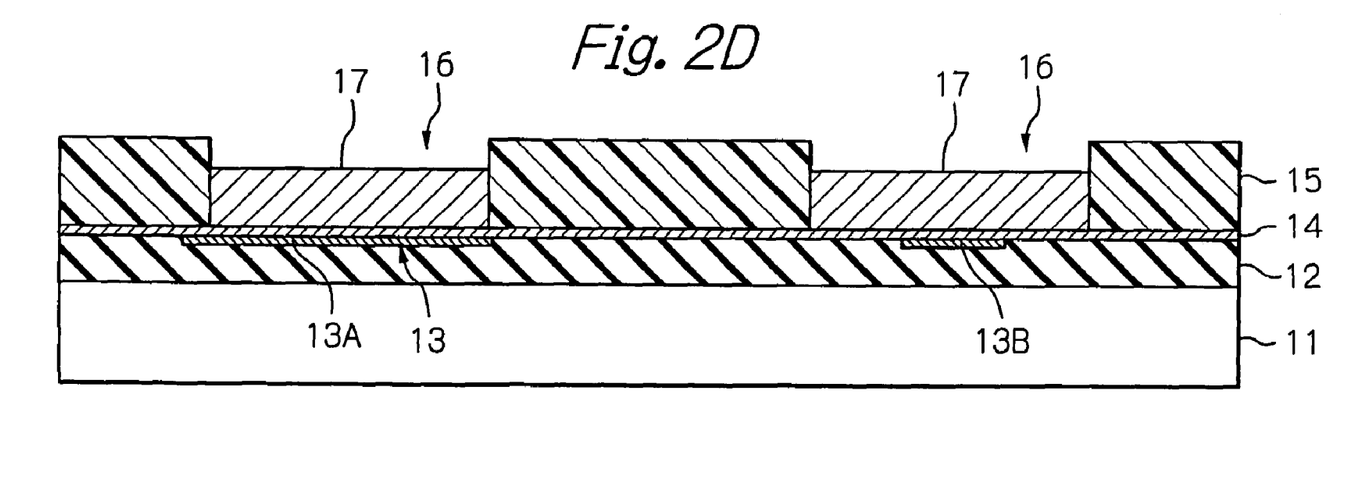

Next, referring to FIG. 2D, a nickel (Ni) electroplating process is carried out so that respective nickel (Ni) layers 17 are grown and formed on the exposed surface areas of the Cu seed layer 14 over a given period of time, with the Cu seed layer 14 serving as a cathode electrode. After the Ni electroplating process is completed, the semiconductor device (wafer) is lifted out of the aqueous Ni electroplating solution.

Figure 2E:
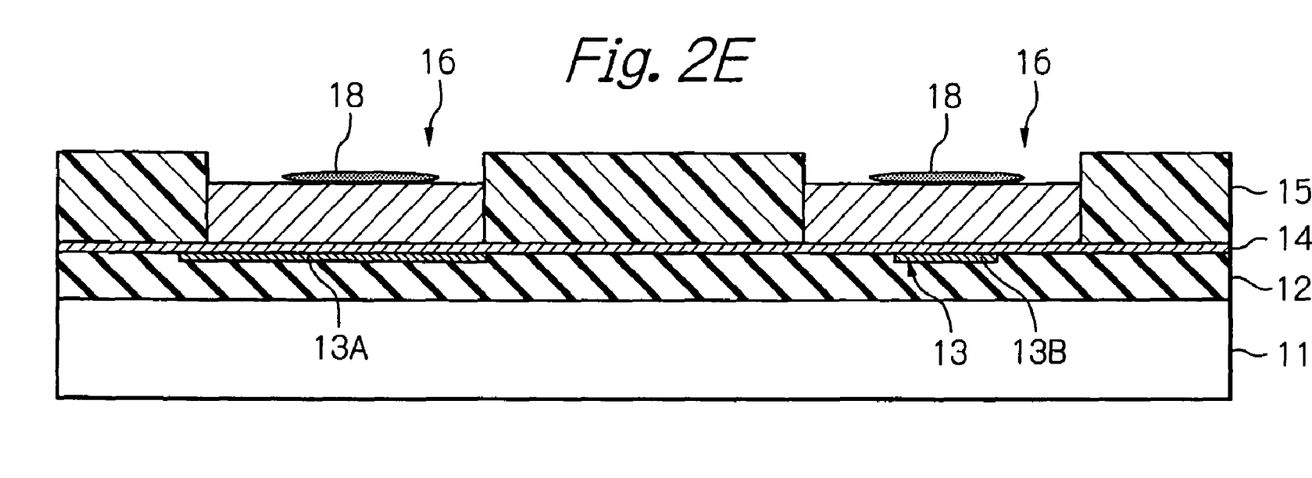

Next, referring to FIG. 2E, the semiconductor device (wafer) is illustrated in a state in which the semiconductor device (wafer) has been just lifted out of the aqueous Ni electroplating solution. At this time, as symbolically illustrated, residue components 18, each of which is composed of the inorganic salts, organic additives and so on contained in the aqueous Ni electroplating solution, are inevitably left on the respective Ni layers 17. Thus, the semiconductor device (wafer) is moved from the nickel-plating bath section 6 to the pure-water washing bath section 4, and the semiconductor device (wafer) is immersed in and washed with the pure water in the pure-water washing bath section 4 over a given period of time, so that the residue components 18 can be washed out of the respective Ni layers 17.

Figure 2F:
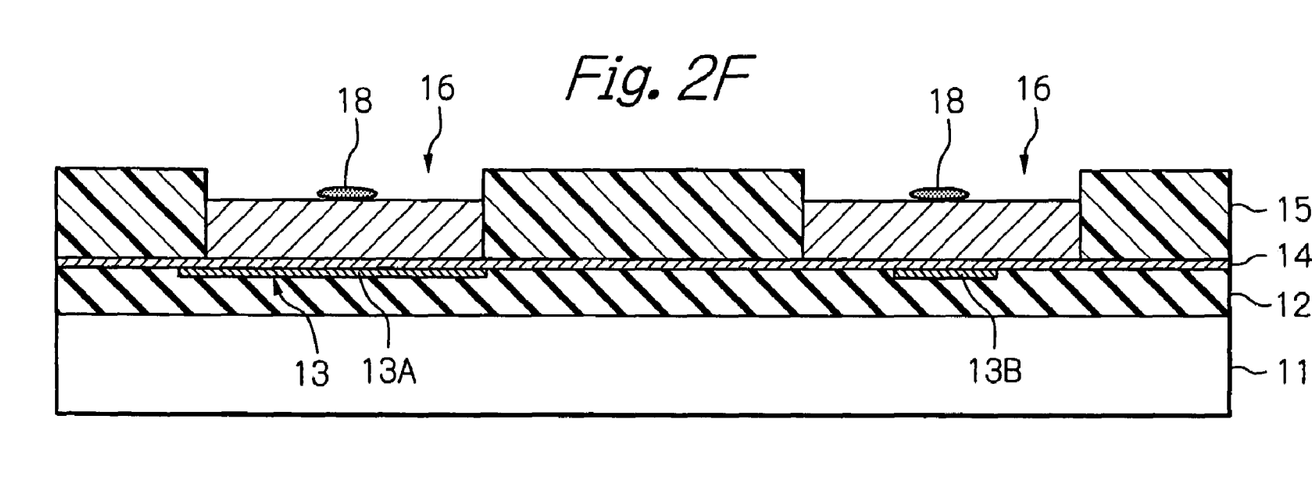

Next, referring to FIG. 2F, the semiconductor device (wafer) is illustrated in a state in which the semiconductor device (wafer) has been just lifted out of the pure water in the pure-water washing bath section 4. Nevertheless, as already discussed hereinbefore, it is impossible to completely remove the residue components 18 out of the respective Ni layers 17 with only the pure water. Then, the semiconductor device (wafer) is moved from the pure-water washing bath section 4 to the acid washing bath section 7 of FIG. 1, and is immersed in and washed with either the aqueous hydrochloric acid solution or the aqueous sulfuric acid solution over a given period of time.

Figure 2G:
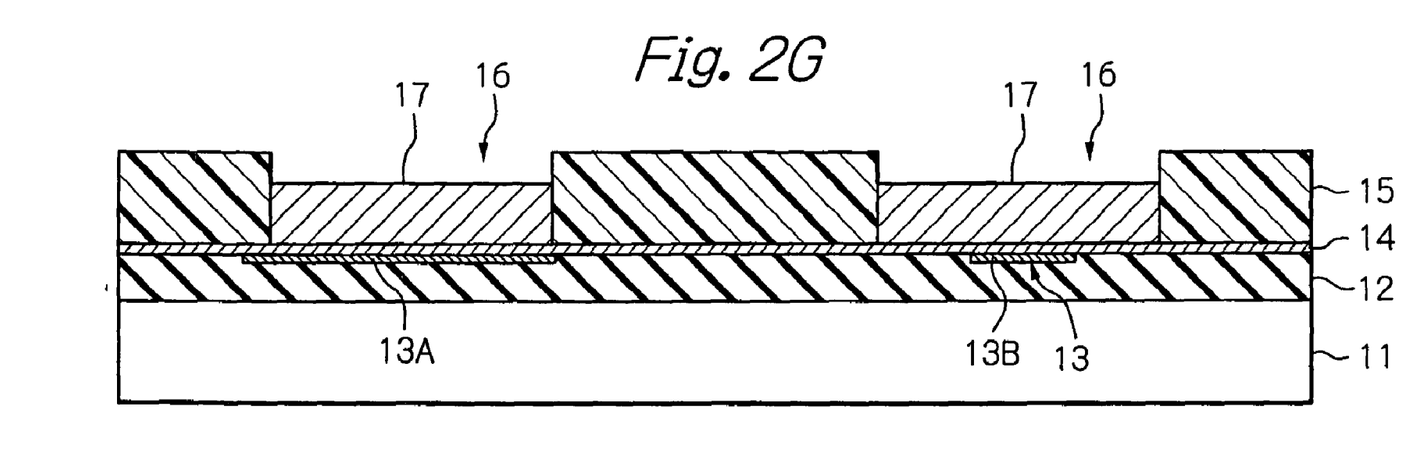

Next, referring to FIG. 2G, the semiconductor device (wafer) is illustrated in a state in which the semiconductor device (wafer) has been just lifted out of either the aqueous hydrochloric acid solution or the aqueous sulfuric acid solution. As illustrated, it is possible to substantially completely remove the residue components 18 from the respective Ni layers 17 by washing the semiconductor device (wafer) with either the aqueous hydrochloric acid solution or the aqueous sulfuric acid solution.

According to the inventor's research, the removal of the residue components 18 from the respective Ni layers 17 can carried out by substituting an aqueous nitric acid solution for either the aqueous hydrochloric acid solution or the aqueous sulfuric acid solution, but the Ni layers 17 is somewhat etched when the aqueous nitric acid solution is used. With the recent advance of miniaturization and integration of semiconductor devices, a control of thickness of various thin layers becomes severer, and thus the use of the aqueous nitric acid solution should be avoided.

In short, according to the inventor's research, by using only either the aqueous hydrochloric acid solution or the aqueous sulfuric acid solution, it is possible to carry out the removal of the residue components 18 from the respective Ni layers 17 without etching the Ni layers 17.

After the removal of the residue components 18 from the respective Ni layers 17, the semiconductor device (wafer) is moved from the acid washing bath section 7 to the pure-water washing bath section 4, in which either the aqueous hydrochloric acid solution or the aqueous sulfuric acid solution is washed out of the semiconductor device (wafer). Then, the semiconductor device (wafer) is moved from the pure-water washing bath section 4 to the plating bath section 8 of FIG. 1, and is immersed in, for example, the aqueous tin (Sn) electroplating solution held in the plating bath section 8.

Figure 2H:
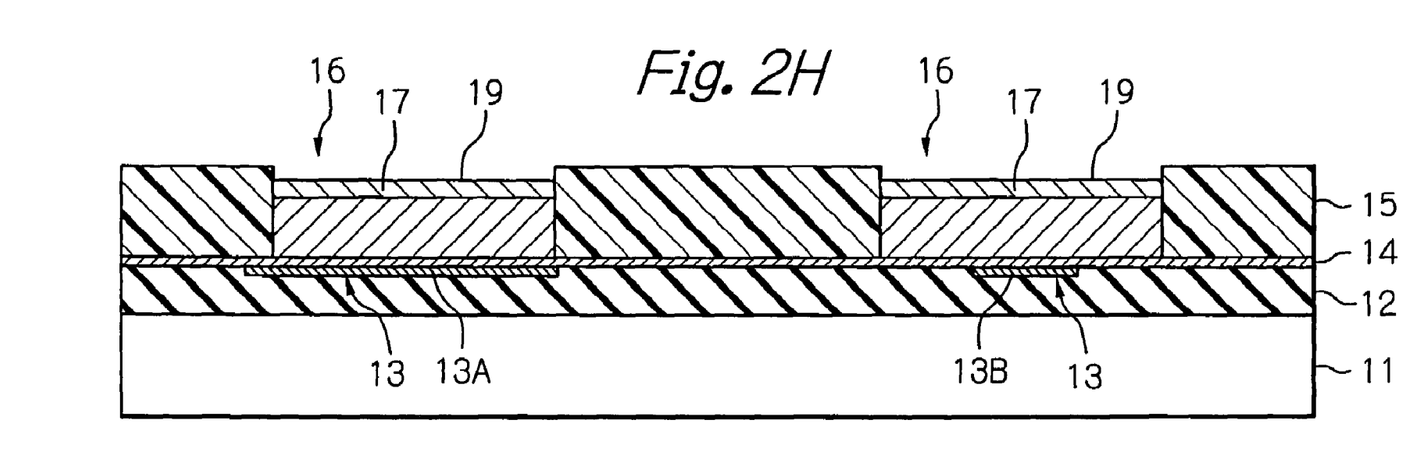

Next, referring to FIG. 2H, a tin (Sn) electroplating process is carried out so that respective tin (Sn) layers 19 are grown and formed on the Ni layers 17 over a given period of time, with the Cu seed layer 14 serving as a cathode electrode.

As stated above, in the plating section 8, any one of the aqueous Sn alloy electroplating solution, the aqueous Cu electroplating solution, the aqueous Cu alloy electroplating solution, the Au electroplating solution and the Au alloy electroplating solution may be substituted for the Sn electroplating solution. In this case, any one of an Sn alloy layer, a Cu layer, a Cu alloy layer, an Au layer and an Au alloy layer may be formed on each of the Ni layers 17 as a substitute for the Sn layer 19.

After the Sn alloy electroplating process is completed, the semiconductor device (wafer) is lifted out of the aqueous Sn alloy electroplating solution, and is moved to the post-treatment section 9 of FIG. 1, in which the semiconductor device (wafer) is washed with the pure water to thereby remove the aqueous tin (Sn) alloy electroplating solution. Then, if necessary, the semiconductor device (wafer) is rested on the spin-dryer provided at the post-treatment section 9, and is spun so that the pure water is drained from the semiconductor device (wafer).

Subsequently, the processed semiconductor device (wafer) is moved from the post-treatment section 9 to the wafer loading/unloading section 2, and is loaded into the wafer cassette (not shown). Thereafter, the wafer cassette is carried out of the wafer loading/unloading section 2, and the semiconductor device (wafer) concerned is unloaded from the wafer cassette. Then, the perforated photoresist layer 15 is removed from the Cu seed layer 14 by using an ashing process, a wet peeling process or the like.

Figure 2I:
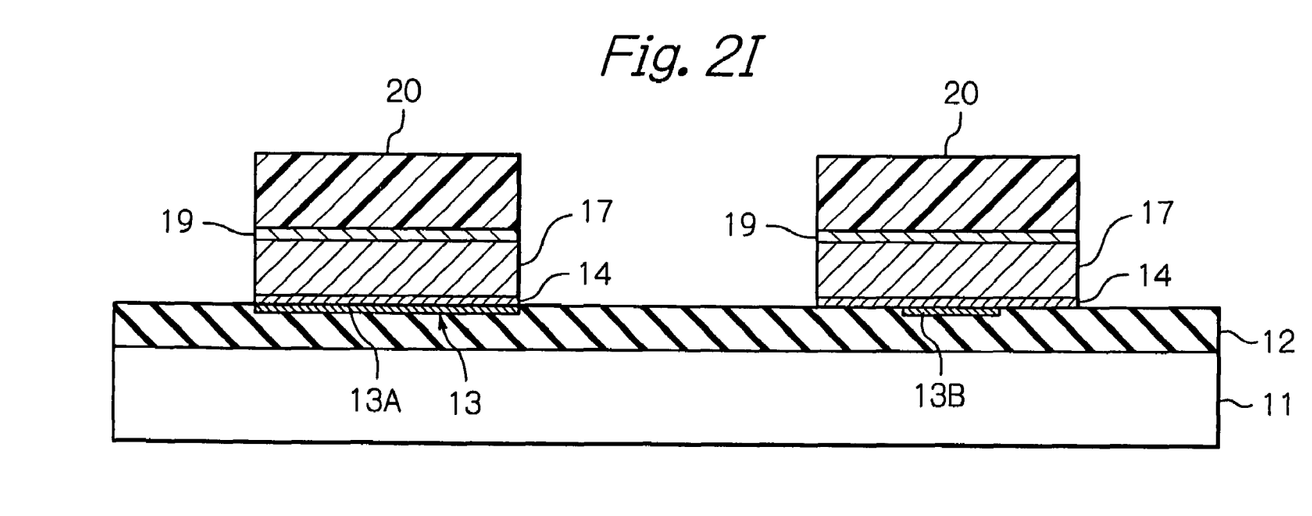

Next, referring to FIG. 2I, a photoresist layer is again formed on the Cu seed layer 14 having the Ni layers 17 formed thereon, by using a spin-coat process, and is patterned by using a photolithography process, so that the respective Sn layers 19 are masked by the patterned photoresist mask layers 20. In other words, the unmasked area on the Cu seed layer 14 is exposed as a redundant area to the exterior. Then, the semiconductor device (wafer) is subjected to an etching process in which the redundant Cu material is removed from the unmasked or redundant area of the Cu seed layer 14. Subsequently, the patterned photoresist mask layers 20 are removed from the Sn layers 19 by using an ashing process, a wet peeling process or the like Next, referring to FIG. 2J, a passivation layer 21 is formed on the surface of the semiconductor device (wafer), and is perforated by using a photolithography process so that the Sn layers are exposed to the exterior, resulting in production of a plurality of FC type semiconductor devices on the semiconductor substrate 11. If necessary, the FC type semiconductor devices on the semiconductor substrate 11 may be subjected to a dicing process, in which the FC type semiconductor devices are separated from each other.

Figure 2J:
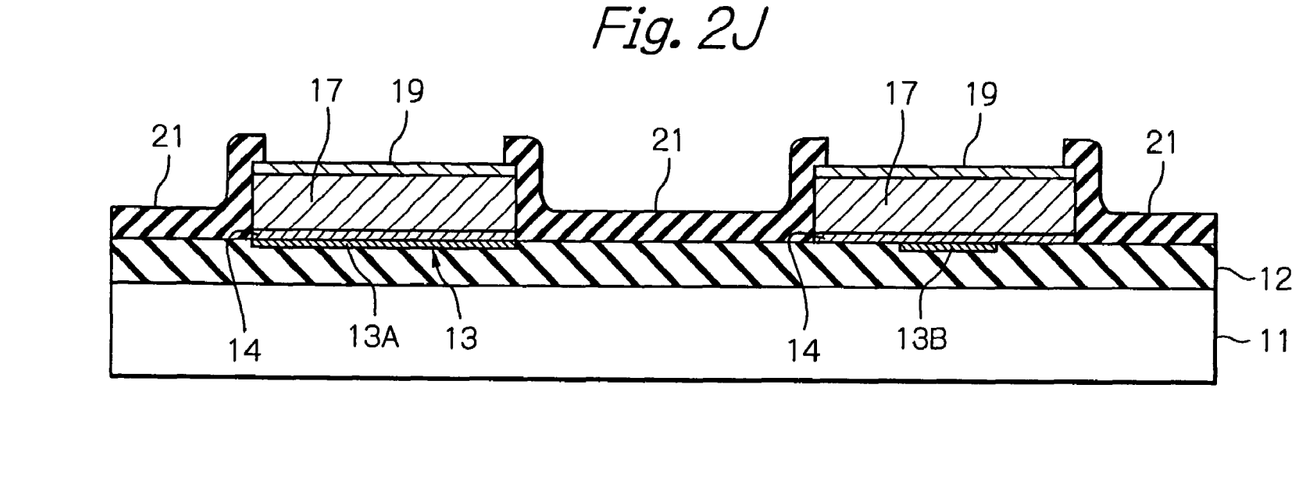

The FC type semiconductor devices thus obtained may be commercially distributed and circulated in a market as parts for manufacturing electronic packages. Otherwise, the FC type semiconductor devices may be temporarily held in a storage. In either event, each of the Sn layers 19 serves as a protective layer for protecting the surface of the corresponding Ni layer 17, and both the Ni layer 17 and the corresponding protective Sn layer 19 form an electrode pad for the FC type semiconductor device.

Figure 2K:
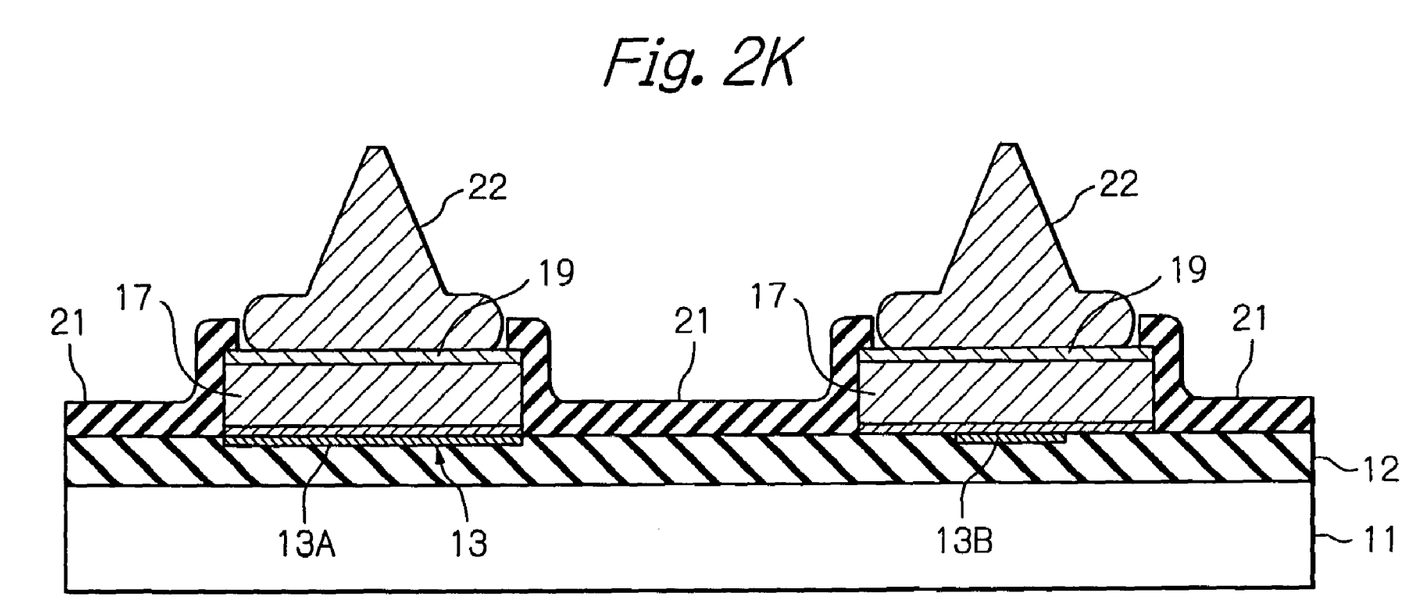

Next, referring to FIG. 2K, respective metal bumps 22 are bonded to the electrode pads (17, 19), resulting in completion of the production of the FC type semiconductor device. The metal bumps 22 may be composed of various metal materials, such as tin (Sn), Sn alloy, copper (Cu), Cu alloy, gold (Au), Au alloy, lead (Pb), Pb alloy or the like. When the Sn bumps or Sn alloy bumps are used as the metal bumps 22, each of the Ni layers 17 serves as a barrier layer for preventing the penetration of the tin atoms into the interior of the FC type semiconductor device. Namely, the use of the Sn bumps or Sn alloy bumps 22 cannot cause any damage in the FC type semiconductor device due to the existence of the barrier Ni layer 17.

In the aforesaid manufacturing method, the aqueous hydrochloric acid solution should have a density falling within a range from 1 to 20 wt %, preferably, from 5 to 15 wt %. Similarly, the aqueous sulfuric acid solution should have a density falling within a range from 1 to 20 wt %, preferably, from 5 to 15 wt %. According to the inventor's research, the density is less than 1 wt %, it has been found the residue components 18 cannot be sufficiently removed from the. Ni layers 17. Also, although the density exceeds 20 wt %, it has been found that the removal of the residue components 18 cannot be remarkably improved and enhanced.

When the FC type semiconductor devices having no metal bumps are not commercially distributed and circulated in the market, and when they are not temporarily held in the storage, the protective Sn layers 19 may be omitted in that it is unnecessary to protect the surfaces of barrier Ni layers 17. Namely; in this case, since the metal bumps 22 are directly bonded on the respective barrier Ni layers 17 soon after the formation of the barrier Ni layers 17 is carried out in the electroplating apparatus 1, the step for forming the protective Sn layers 19 (see: FIG. 2H) may be omitted from the method of FIGS. 2A through 2K.

Figure 3:
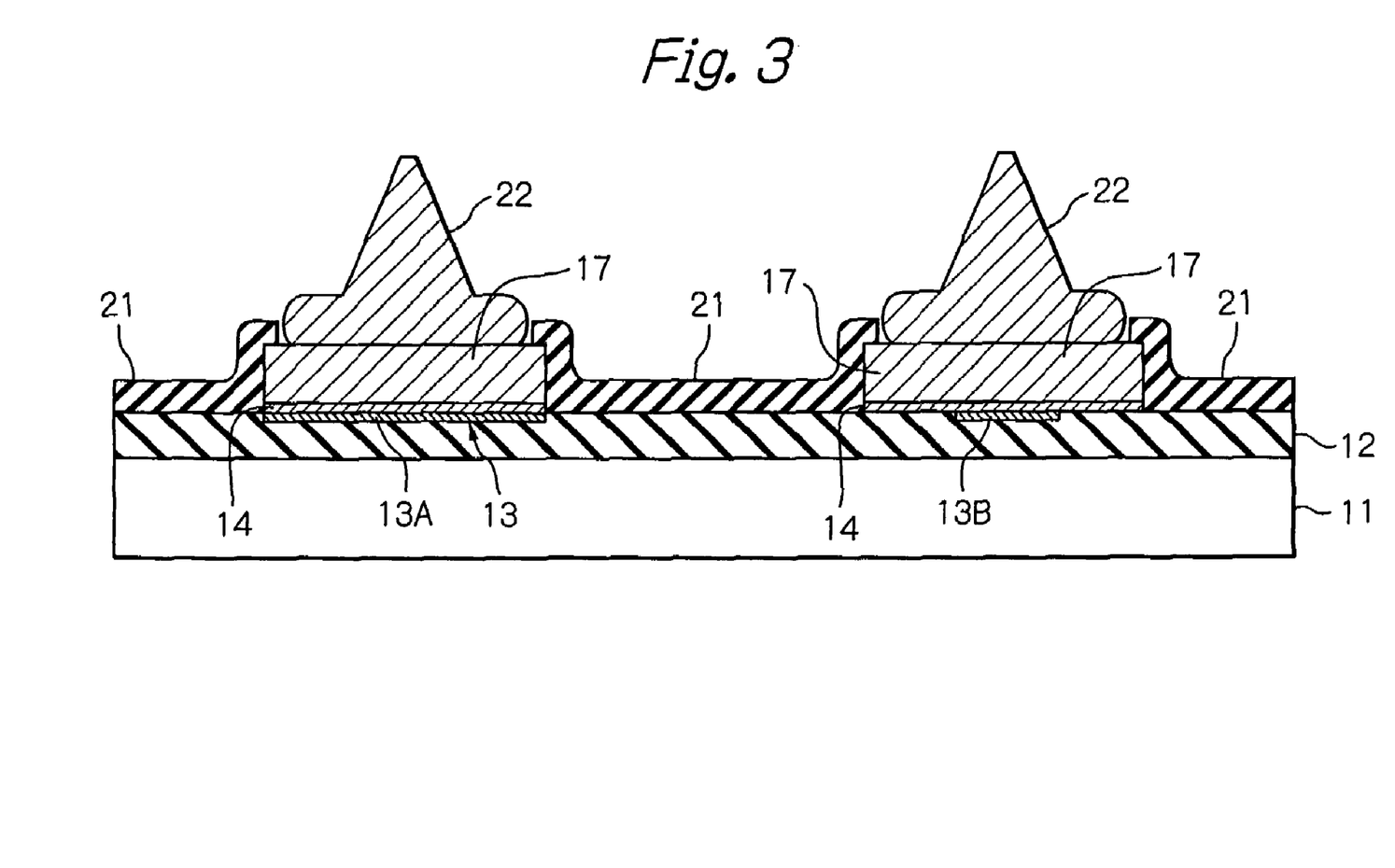
FIG. 3 is a partial cross-sectional view of an FC type semiconductor device which obtained by a modification of the manufacturing method of FIGS. 2A through 2K.

Referring to FIG. 3 which corresponds to FIG. 2K, a FC type semiconductor device is illustrated, which is obtained by omitting the step for forming the protective Sn layers 19 (see: FIG. 2H) from the method of FIGS. 2A through 2K. In this case, each of the barrier Ni layers 17 forms an electrode pad for the FC type semiconductor device.

Figure 4A:
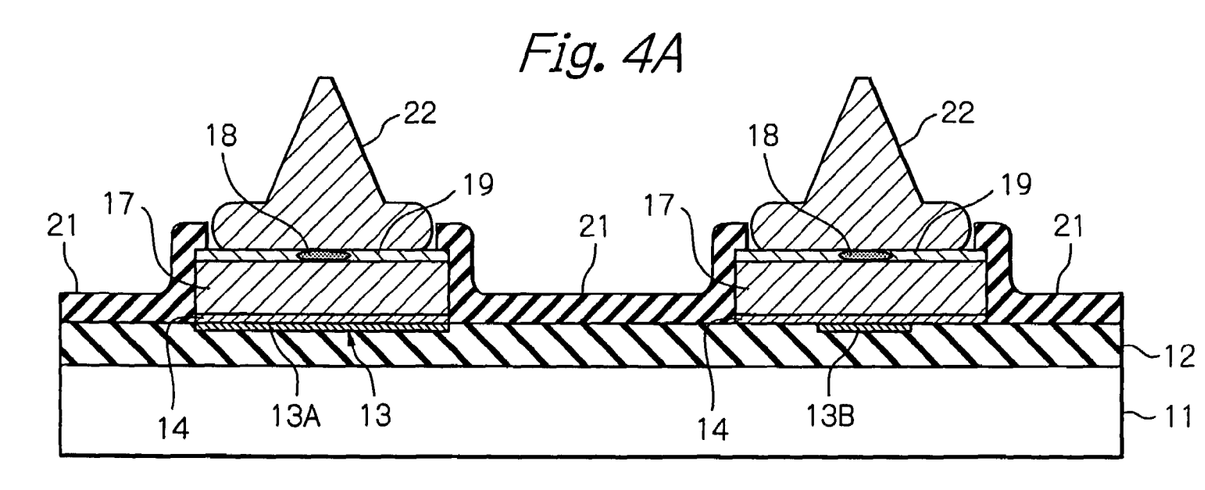
FIGS. 4A and 4B are partial cross-sectional views for explaining the effects or advantages of the present invention.
Figure 4B:
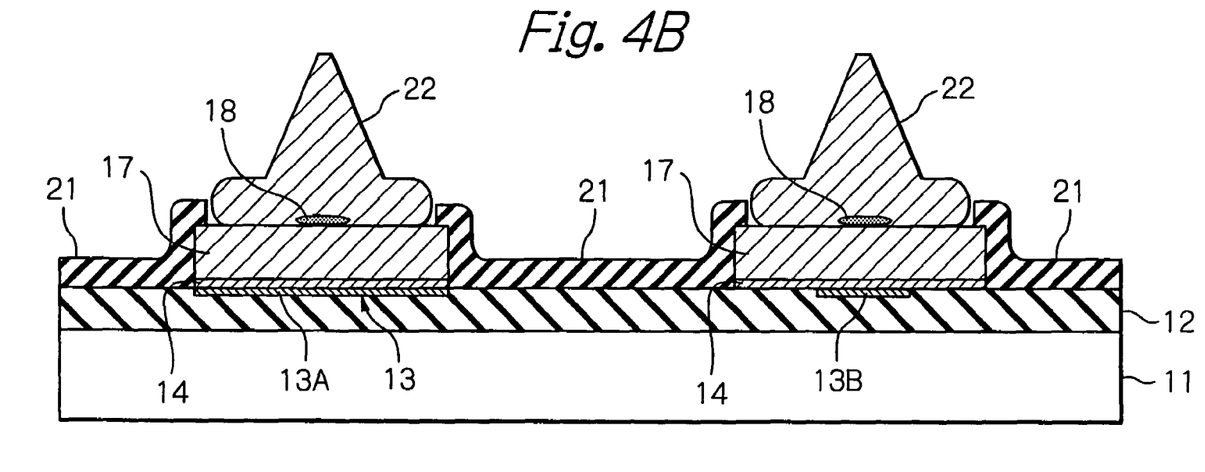

FIGS. 4A and 4D are partial cross-sectional views for explaining the effects or advantages of the present invention.

As shown in FIG. 4A which corresponds to FIG. 2K, when the step for washing the semiconductor device (wafer) with either the aqueous hydrochloric acid solution or the aqueous sulfuric acid solution (see: FIG. 2F) is omitted, the residue components 18 are intervened between the barrier Ni layers 17 and the protective Sn layers 19. The residue components 18 causes a corrosion of the Ni layers 17 and Sn layers, resulting in decline of an adhesion strength between the barrier Ni layers 17 and the protective Sn layers 19. Thus, each of the protective Sn layers 19 is liable to be easily peeled from the corresponding barrier Ni layer 17, resulting in premature deterioration of the FC type semiconductor device.

However, according to the present invention, it is possible to obtain a sufficient adhesion strength between the barrier Ni layers 17 and the protective Sn layers 19, because the residue components 18 can be substantially completely removed from the surfaces of the barrier Ni layers 17 by washing the semiconductor device (wafer) with either the aqueous hydrochloric acid solution or the aqueous sulfuric acid solution.

Similarly, as shown in FIG. 4B which corresponds to FIG. 3, when the metal bumps 22 are directly bonded to the barrier Ni layers 17 having the residue components 18 left thereon, bonding strengths between the barrier Ni layers 17 and the metal bumps 22 are declined due to the existence of the residue components 18 therebetween.

However, according to the present invention, it is possible to obtain a sufficient bonding strength between the barrier Ni layers 17 and the metal bumps 22.

In the aforesaid manufacturing method, although the barrier Ni layers 17 and the protective Sn layers are formed by using the electroplating processes, the formation of the barrier Ni layers 17 and the formation of the protective Sn layers 19 may be carried out by using electroless plating processes.

In this case, in the plating apparatus 1 of FIG. 1, the nickel-plating bath section 6 holds an aqueous nickel (Ni) electroless plating solution, and the plating bath section 8 holds, for example, an aqueous tin (Sn) electroless plating solution.

Note, any one of an aqueous tin (Sn) alloy electroless plating solution, an aqueous copper (Cu) electroless plating solution, an aqueous copper (Cu) alloy electroless plating solution, a gold (Au) electroless plating solution and a gold (Au) alloy electroless plating solution may be substituted for the aqueous tin (Sn) electroless plating solution.

FIGS. 5A through 5E show a modification of the manufacturing method of FIGS. 2A through 2K, in which the Ni layer 17 and the Sn layer 19 are formed by using electroless plating processes.

Figure 5A:
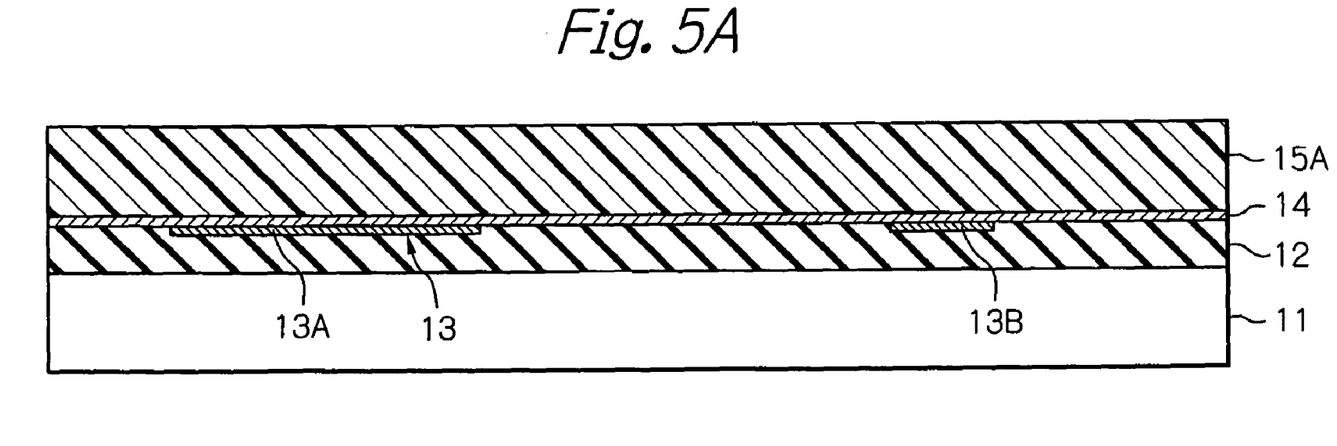
FIGS. 5A through 5E are partial cross-sectional views for explaining a modification of the manufacturing method of FIGS. 2A through 2K.

First, referring to FIG. 5A, after the formation of the Cu seed layer 14 is completed, a photoresist layer 15A is formed on the Cu seed layer 14 by using a spin-coat process.

Figure 5B:
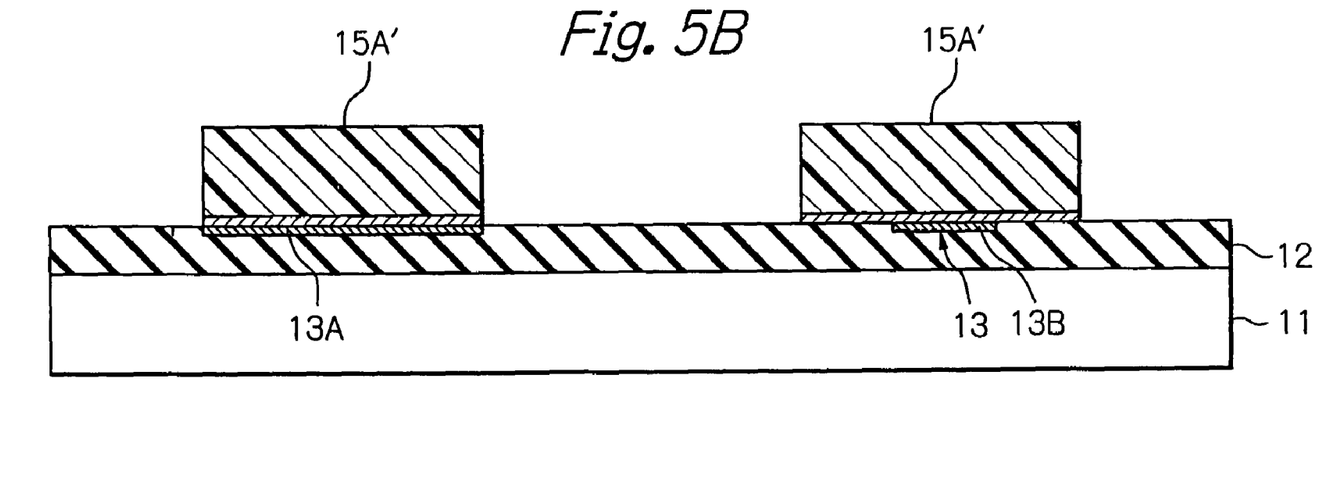

Next, referring to FIG. 5B, the photoresist layer 15A is patterned by using a photolithography process, so that areas on the Cu seed layer 14, on which respective electrode pads should be formed, are masked by the patterned photoresist mask layers 15A'. Namely, the unmasked area on the Cu seed layer 14 is exposed as a redundant area to the exterior. Then, the semiconductor device (wafer) is subjected to an etching process, in which the redundant Cu material is removed from the unmasked or redundant area of the Cu seed layer 14, so that the masked areas on the Cu seed layer 14 are left as electrode-pad formation areas 14 on the uppermost wiring pattern layer 13. Subsequently, the patterned photoresist mask layers 15A' are removed from the electrode-pad formation areas 14 by using an ashing process, a wet peeling process or the like.

Figure 5C:
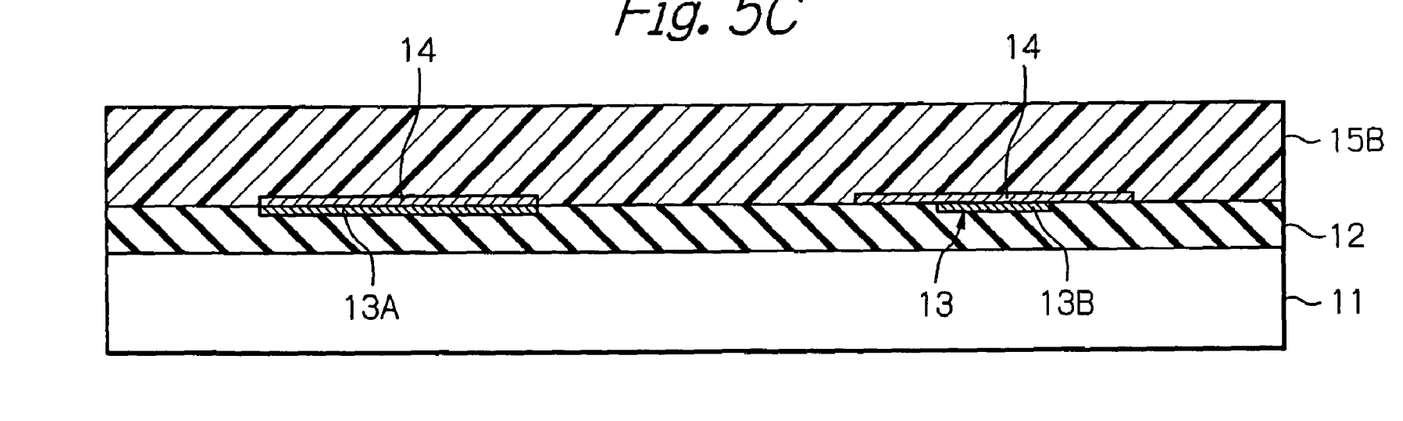

Next, referring to FIG. 5C, a photoresist layer 15B is again formed on the surface of the multi-layered wiring structure 12 so that the uppermost wiring pattern layer 13 and the electrode-pad formation areas 14 are covered with the photoresist layer 15B.

Figure 5D:
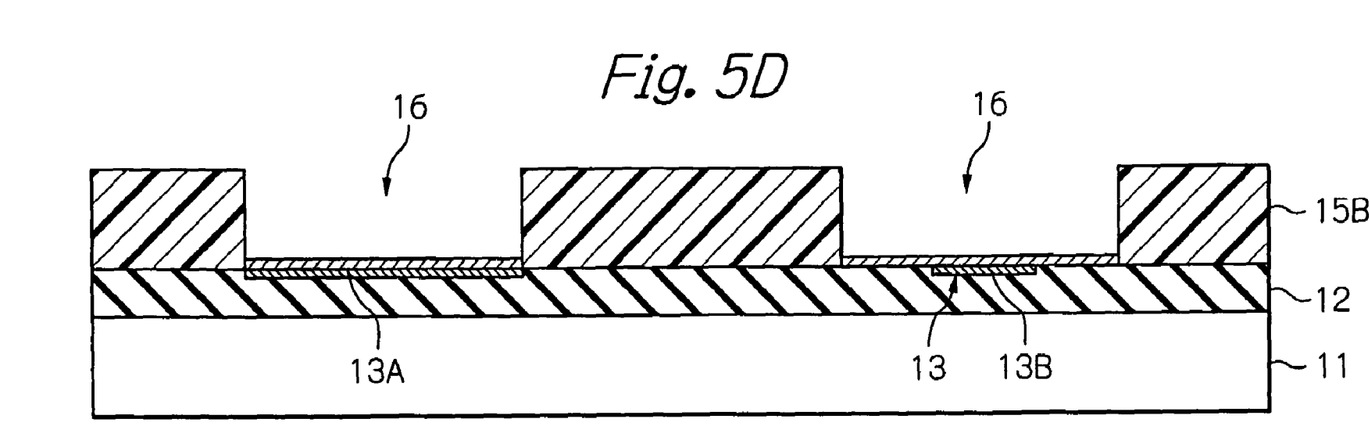

Next, referring to FIG. 5D, the photoresist layer 15B is perforated by using a photolithography process so that respective openings 16 are formed in the photoresist layer 15B, whereby the electrode-pad formation areas 14 are exposed to the exterior.

Thereafter, the semiconductor substrate device (wafer) is loaded into a wafer cassette (not shown), and the wafer cassette is carried into the wafer loading/unloading section 2 of the electroplating apparatus 1 of FIG. 1.

Figure 5E:
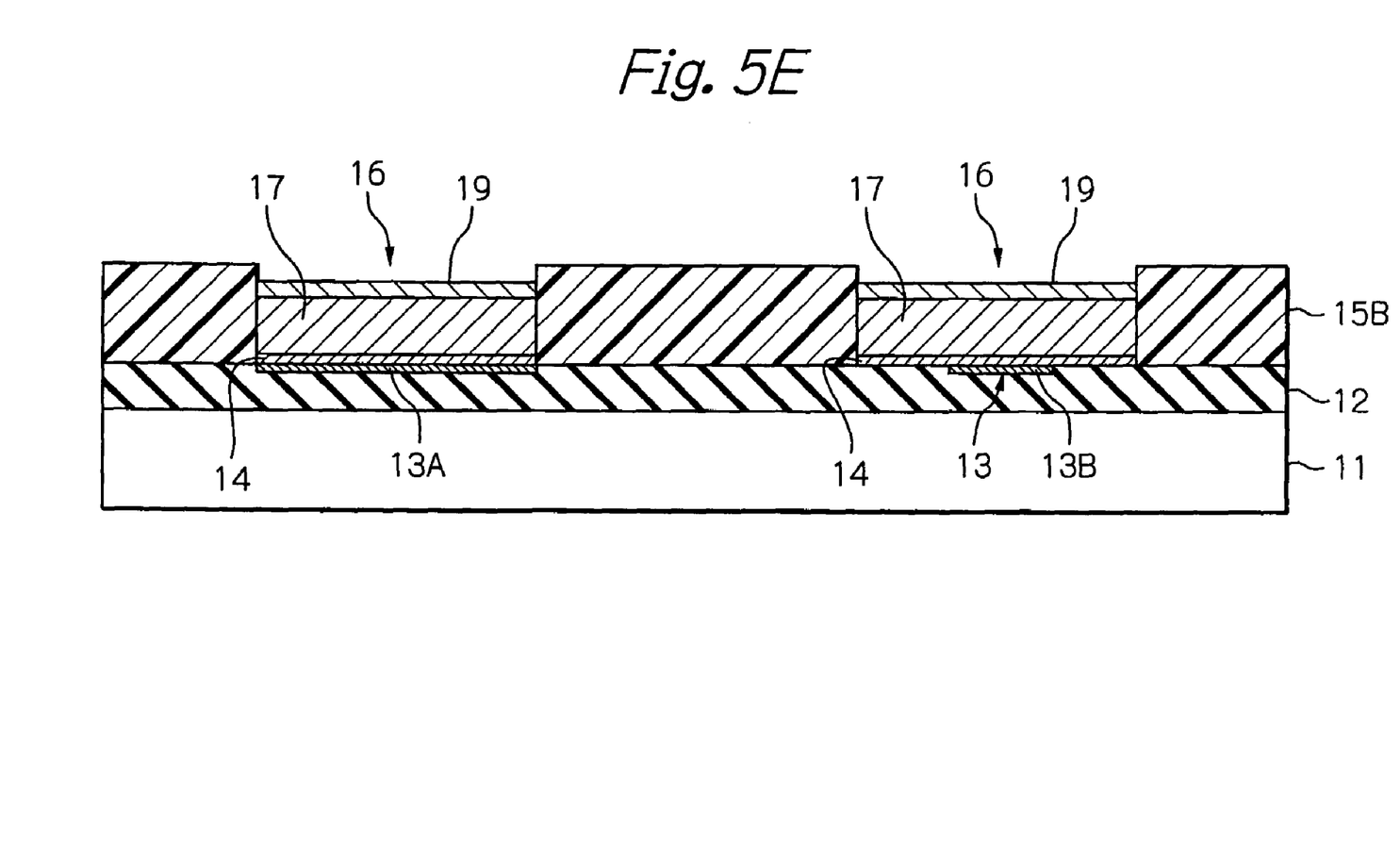

Next, referring to FIG. 5E, the semiconductor device (wafer) is processed in substantially the same manner as explained with reference to FIGS. 2D through 2H, so that the nickel layer 17 and the Sn layer 19 are formed in order on each of the electrode-pad formation areas 14 by using the electroless plating processes. Of course, after the formation of the Ni layers 17 is completed, the Ni layers 17 are washed with the pure water at the pure-water washing bath section 4 of FIG. 1, and are then washed with either the aqueous hydrochloric acid solution or the aqueous sulfuric acid solution at the acid washing section 7 of FIG. 1.

Thereafter, the perforated photoresist layer 15B is removed from the surface of the semiconductor device (wafer) by using an ashing process, a wet peeling process or the like, and is processed in substantially the same manner as explained with reference to FIGS. 2J and 2K.

In the aforesaid manufacturing method, although the semiconductor device (wafer) is immersed in either the either the aqueous hydrochloric acid solution or the aqueous sulfuric acid solution to thereby remove the residue components 18 from the Ni layers 17, the semiconductor device (wafer) may be sprayed with either the aqueous hydrochloric acid solution or the aqueous sulfuric acid solution for the removal of the residue components 18 from the Ni layers 17.

Also, in the aforesaid manufacturing method, after the formation of the Ni layers 17 is completed, the semiconductor device (wafer) may be directly washed with either the aqueous hydrochloric acid solution or the aqueous sulfuric acid solution without washing with the pure water, if necessary.

Further, in the aforesaid manufacturing method, a nickel-based metal layer such as a nickel (Ni) alloy layer may be substituted for each of the Ni layers, provided that the nickel-based metal layer serves as a barrier layer for preventing the penetration of the tin atoms into the interior of the FC type semiconductor device.

Finally, it will be understood by those skilled in the art that the foregoing description is of preferred embodiments of the devices, and that various changes and modifications may be made to the present invention without departing from the spirit and scope thereof.

The invention claimed is:

1. A method for manufacturing a semiconductor device, which comprises:
    forming a photoresist layer over a semiconductor substrate;
    forming openings in said photoresist layer;
    forming one of a nickel layer and a nickel-based metal layer on or above said semiconductor substrate in each of said openings by using a first plating process;
    washing said semiconductor substrate, on or above which said one of said nickel layer and said nickel-based metal layer is formed in each of said openings, with a pure water;
    washing said semiconductor substrate, which is washed with said pure water, with one of an aqueous hydrochloric acid solution and an aqueous sulfuric acid solution;
    after said washing said semiconductor substrate with one of an aqueous hydrochloric acid solution and an aqueous sulfuric acid solution, forming a protective metal layer on said one of said nickel layer and said nickel-based metal layer in each of said openings by using a second plating process; and
    after said forming said protective metal layer on said one of said nickel layer and said nickel-based metal layer in each of said openings, removing said photoresist layer from said semiconductor substrate.

2. The method as set forth in claim 1, wherein said semiconductor substrate includes a multi-layered wiring structure formed thereon, the formation of said one of said nickel layer and the nickel-based metal layer being carried out on a top surface of said multi-layered wiring structure.

3. The method as set forth in claim 2, wherein said multi-layered wiring structure includes an uppermost wiring pattern layer formed on the top surface thereof, the formation of said one of said nickel layer and thee nickel-based metal layer being carried out on said uppermost wiring pattern layer.

4. The method as set forth in claim 3, wherein said uppermost wiring pattern layer comprises one of aluminum and copper.

5. The method as set forth in claim 3, wherein said one of said nickel layer and said nickel-based metal layer serves as an electrode pad on said uppermost wiring pattern layer.

6. The method as set forth in claim 5, further comprising forming a metal seed layer on said uppermost wiring pattern layer before said plating process is executed, the formation of said one of said nickel layer and said nickel-based metal layer being carried out on said metal seed layer.

7. The method as set forth in claim 6, wherein said metal seed layer comprises a copper layer.

8. The method as set forth in claim 1, wherein said nickel-based metal layer comprises a nickel alloy layer.

9. The method as set forth in claim 1, wherein said plating process comprises an electroplating process.

10. The method as set forth in claim 1, wherein said plating process comprises an electroless plating process.

11. The method as set forth in claim 1, wherein said aqueous hydrochloric acid solution has a density within a range from 1 to 20 wt %.

12. The method as set forth in claim 1, wherein said aqueous sulfuric acid solution has a density within a range from 1 to 20 wt %.

13. The method as set forth in claim 1, further comprising washing said one of said nickel layer and said nickel-based metal layer with pure water before said one of said nickel layer and said nickel-based metal layer is washed with one of the aqueous hydrochloric acid solution and the aqueous sulfuric acid solution.

14. The method as set forth in claim 1, wherein said protective metal layer comprises one selected from a group consisting of tin, tin alloy, copper, copper alloy, gold and gold alloy.

15. The method as set forth in claim 1, wherein said aqueous hydrochloric acid solution has a density within a range from 5 to 15 wt %.

16. The method as set forth in claim 1, wherein said aqueous sulfuric acid solution has a density within a range from 5 to 15 wt %.

* * * * *